United States Patent
Bai et al.

(10) Patent No.: US 10,060,941 B2
(45) Date of Patent: Aug. 28, 2018

(54) MAGNETORESISTIVE GEAR TOOTH SENSOR

(71) Applicant: Multidimension Technology Co., Ltd., Zhangjiagang (CN)

(72) Inventors: Jianmin Bai, Zhangjiagang (CN); James Geza Deak, Zhangjiagang (CN); Hua Iv, Zhangjiagang (CN); Weifeng Shen, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 461 days.

(21) Appl. No.: 14/405,736

(22) PCT Filed: Jun. 4, 2013

(86) PCT No.: PCT/CN2013/076707
§ 371 (c)(1),
(2) Date: Dec. 4, 2014

(87) PCT Pub. No.: WO2013/182036
PCT Pub. Date: Dec. 12, 2013

(65) Prior Publication Data
US 2015/0145504 A1  May 28, 2015

(30) Foreign Application Priority Data
Jun. 4, 2012  (CN) .......................... 2012 1 0180465

(51) Int. Cl.
*G01R 33/09* (2006.01)
*G01P 3/488* (2006.01)
(Continued)

(52) U.S. Cl.
CPC .............. *G01P 3/488* (2013.01); *G01D 5/142* (2013.01); *G01P 3/54* (2013.01); *G01P 13/045* (2013.01);
(Continued)

(58) Field of Classification Search
CPC .......... G01P 3/488; G01P 3/54; G01P 13/045; G01R 33/093; G01R 33/098; G01D 5/142
See application file for complete search history.

(56) References Cited

U.S. PATENT DOCUMENTS 8,080,993 B2    1/2011  Theuss et al.
2004/0252419 A1* 12/2004  Takano ................ G11B 5/3912
                                                                360/324.12
(Continued)

FOREIGN PATENT DOCUMENTS

CN         101545914 A     9/2009
CN         202013413 U    10/2011
(Continued)

OTHER PUBLICATIONS

"International Application Serial No. PCTCN2013076707, International Preliminary Report on Patentability dated Dec. 9, 2014", (w/ English Translation), 23 pgs.
(Continued)

Primary Examiner — Son Le
(74) Attorney, Agent, or Firm — Schwegman Lundberg & Woessner, P.A.

(57) ABSTRACT

The present invention discloses a magnetoresistive gear tooth sensor, which includes a magnetoresistive sensor chip and a permanent magnet. The magnetic sensor chip is comprised of at least one magnetoresistive sensor bridge, and each arm of the sensor bridge has at least one MTJ element group. The magnetoresistive gear tooth sensor has good temperature stability, high sensitivity, low power consumption, good linearity, wide linear range, and a simple structure. Additionally, the magnetoresistive gear tooth sensor has a concave soft ferromagnetic flux concentrator, which can be used to reduce the component of the magnetic field generated by the permanent magnet along the sensing direction of the MTJ sensor elements, enabling a wide linear (Continued)

range. Because it is arranged as a gradiometer, the magnetoresistive gear tooth sensor bridge is not affected by stray magnetic field; it is only affected by the gradient magnetic field generated by gear teeth in response to the permanent magnet bias. The magnetoresistive gear tooth sensor of the present invention is able to detect the position of a specific tooth or a missing tooth of a gear. This magnetoresistive gear tooth sensor is also capable of determining the speed and direction of motion of a gear.

20 Claims, 10 Drawing Sheets

(51) Int. Cl.
    *G01P 3/54*         (2006.01)
    *G01P 13/04*       (2006.01)
    *G01D 5/14*        (2006.01)

(52) U.S. Cl.
    CPC .......... *G01R 33/093* (2013.01); *G01R 33/098* (2013.01)

(56) References Cited

U.S. PATENT DOCUMENTS

| | | | | |
|---|---|---|---|---|
| 2007/0170533 A1* | 7/2007 | Doogue | ................ | B82Y 25/00 257/422 |
| 2008/0247098 A1* | 10/2008 | Deak | ................ | G11C 11/16 360/328 |
| 2008/0309331 A1* | 12/2008 | Qian | ................ | B82Y 25/00 324/252 |
| 2009/0243595 A1* | 10/2009 | Theuss | ................ | B29C 45/14639 324/207.11 |
| 2009/0256552 A1 | 10/2009 | Guo et al. | | |
| 2009/0260719 A1* | 10/2009 | Iben | ................ | B82Y 25/00 148/122 |
| 2009/0315543 A1 | 12/2009 | Guo et al. | | |
| 2013/0106410 A1* | 5/2013 | Liu | ................ | G01R 33/0029 324/246 |
| 2013/0320970 A1* | 12/2013 | Foletto | ................ | G01D 5/2448 324/251 |
| 2013/0334634 A1 | 12/2013 | Deak et al. | | |
| 2014/0035570 A1 | 2/2014 | Jin et al. | | |
| 2014/0035573 A1 | 2/2014 | Deak et al. | | |

FOREIGN PATENT DOCUMENTS

| | | |
|---|---|---|
| CN | 102298124 A | 12/2011 |
| CN | 202210144 U | 5/2012 |
| CN | 102809665 A | 12/2012 |
| CN | 202599967 U | 12/2012 |
| JP | 2009-122041 A | 6/2009 |
| WO | WO-2013/182036 A1 | 12/2013 |

OTHER PUBLICATIONS

"International Application Serial No. PCTCN2013076707, International Search Report dated Sep. 5, 2013", (w/ English Translation), 8 pgs.

"International Application Serial No. PCTCN2013076707, Written Opinion dated Sep. 5, 2013", (w/ English Translation), 21 pgs.

European Patent Application No. 13800125.0, Extended European Search Report dated Dec. 2, 2015, 9 pgs.

European Patent Application No. 13800125.0, Response and Amendment filed Jun. 28, 2016, 8 pgs.

* cited by examiner

MAGNETORESISTIVE GEAR TOOTH SENSOR

CROSS-REFERENCE TO A RELATED APPLICATION

This application is a 35 U.S.C. § 371 national phase application of PCT/CN2013/076707, filed on Jun. 4, 2013, which claims a priority to a Chinese Patent Application No. CN 201210180465.0, filed on Jun. 4, 2012, incorporated herein by reference in its entirety.

TECHNICAL FIELD

The present invention relates to magnetic position and speed detection sensors, and particularly relates to the use of MTJ elements configured as a magnetoresistive gear tooth sensor.

BACKGROUND

Gear tooth sensors are mainly used in automatic control systems to measure the speed and direction of rotation of a gear. Presently, the most commonly used gear tooth sensors utilize optical or magnetic sensing. In rotating mechanical systems harsh conditions such as vibration, shock, oil, and etc. are present which are not well tolerated by optical sensing, and do not affect magnetic sensors, so magnetic sensors have advantages over optical sensors in these systems. There are many different types of magnetic sensors used in prior art as the magnetic sensor element of a magnetic gear tooth sensor, including Hall (Hall) effect sensors, anisotropic magnetoresistance (AMR) sensors, and giant magnetoresistance (GMR) sensors.

Hall Effect sensors have very low sensitivity, typically requiring the use of a flux concentrator to increase sensitivity of the sensor which also increases size and weight. In addition, the Hall sensor element is a sensor has high power consumption and concentrators can exhibit poor linearity. AMR elements have higher sensitivity than Hall Effect elements, but suffer from much narrower linear working range. AMR element's also require a 'set/reset' coil used to reduce hysteresis, which not only leads to a more complex manufacturing process, hut also increases AMR sensor size and power consumption. GMR sensors have higher sensitivity than AMR elements, but also suffer from narrow linear working range. Further, the response curve of a multilayer element is unipolar, and multilayer GMR elements cannot measure the polarity of the magnetic field.

In recent years, a new type of magnetoresistive sensor, known as a magnetic tunnel junction (MTJ) have begun to find acceptance for use as magnetic sensors in industrial applications. The working principle of an element is based on the use of the tunneling magnetoresistance effect (TMR) in magnetic multilayer films. MTJ elements show much higher magnetoresistance than AMR or GMR elements. Compared with the Hall Effect, an MTJ sensor has better temperature stability, higher sensitivity, lower power consumption and better linearity, and requires no extra flux concentrator structure to improve sensitivity. Compared with AMR sensors, MTJ sensors have better temperature stability, higher sensitivity, wider linear operating region, and they do not require the extra 'set/reset' coil structure. Compared with GMR sensors. MTJ sensors have improved temperature stability, higher sensitivity, lower power consumption, and a wider linear operating range.

Magnetic gear tooth sensors typically use a printed circuit board (PCB) based structure to support the components. PCB based gear sensor is usually comprised of a magnetic sensor chip, some circuitry, and a permanent magnet. The permanent magnet produces an applied magnetic field $H_{apply}$, which produces a change in the presence of a gar tooth that the magnetic sensor chips detect and then output a proportional voltage signal; the peripheral circuit is used for signal processing and conversion of the sensor output into an appropriate signal. The applied field generated by the permanent magnets produces a weak $H_{apply}$ at the physical location of the magnetic sensor chip along the sensing direction, which limits the amount of field it can be designed to deliver. As a result, for the PCB type gear tooth sensor, improved suppression of external interference and increased $H_{apply}$ are technical challenges that remain to be solved.

Although MTJ elements have very high sensitivity, they have the following issues:

(1) External magnetic field generated by the permanent magnets along the sensitive direction of the MTJ element $H_{apply}$ is too large, causing the MTJ element to exhibit nonlinear performance, or worse still saturating the MTJ element;

(2) The magnetic field at the physical location of the sensor chips produced by the permanent magnets $H_{apply}$ and the external magnetic field can change, making the MTJ elements vulnerable to outside magnetic field interference in addition to drift in $H_{apply}$ produced by the permanent magnet;

(3) Inability to determine the position of a gear tooth or the existence of missing gear teeth;

(4) No method to determine the direction of movement of the gear;

(5) Low cost mass production has not yet been achieved.

Therefore, a need to improve magnetic gear tooth sensor technology to accurately sense the motion and health of gears.

SUMMARY OF THE INVENTION

The object of the present invention is to provide a magnetoresistive gear tooth sensor.

Accordingly the invention describes a magnetoresistive gear tooth sensor including a magnetic sensor chip, a first permanent magnet, wherein the magnetic sensor chip includes at least one bridge, and each arm of the bridge includes at least one MTJ element group, and an MTJ element group comprises at least one MTJ sensor element.

Preferably, the magnetoresistive gear tooth sensor further comprises a soft ferromagnetic flux concentrator with a U-shaped slot placed between the first permanent magnet and the sensor chip such that the slot is located on the side of the soft ferromagnetic flux concentrator facing the sensor chip.

Preferably, each sensor arm comprises a multiplicity of MTJ element groups interconnected in series, parallel, or a combination of series and parallel.

Preferably, the multiplicity of series, parallel or combination of series and parallel interconnected MTJ elements in each MTJ element group has the same sensing direction.

Preferably, the MTJ element groups within each arm of the sensor bridge have the same sensing direction.

Preferably, the sensor chip comprises a half-bridge, full-bridge, or two full bridges wired as a gradiometer.

Preferably, each MTJ group comprises a plurality of MTJ elements connected in series, parallel, or a combination thereof.

Preferably, each MTJ element group comprises a series, parallel, or a combination of series and parallel connected elements having the same sensitive direction.

Preferably, each of the MTJ element is comprised of a multilayered structure with the following sequence: a pinning layer, a ferromagnetic pinned layer, a tunnel barrier, and a ferromagnetic free layer.

Preferably, the magnetoresistive gear tooth sensor, further comprising a pair of second permanent magnets positioned adjacent to each MTJ element group in order to provide a bias magnetic field for each MTJ element group and perpendicular to the sensing direction of the MTJ element groups.

Alternatively, the magnetoresistive gear tooth sensor, further comprises a pair of second permanent magnets positioned on both of the sides of each MTJ element group obliquely with respect to the sensing direction of the corresponding MTJ element group such that the pair of second permanent magnets provides a bias magnetic field cancelling the Neel coupling generated by of the MTJ elements within the MTJ element group.

Preferably, each of the second permanent magnets has a magnetization that is aligned at an angle with respect to the sensitive direction of the MTJ element group in order to better cancel Neel coupling.

Preferably, each of the MTJ elements is a multilayer structure comprising a sequence of layers that are sequentially deposited, including a pinned layer, a tunnel barrier layer, a free layer and a magnetic bias layer.

More preferably, each of the MTJ element groups further comprises an isolation layer between the magnetic bias layer and the ferromagnetic freelayer.

Preferably, the magnetoresistive gear tooth sensor further comprises a control circuit electrically connected to the magnetic sensor chip.

Preferably, the control circuitry is used to determine the position of a gear tooth according to a relationship between the position of the gear tooth and the voltage signals of the magnetoresistive gear tooth sensor bridge.

Preferably, the magnetic sensor chip includes two full bridge sensors, wherein each arm of the two full bridge sensors includes an MTJ element group, and the microcontroller is used to determine the movement direction of a gear using the voltage output of the gear tooth sensor bridges.

Preferably, the magnetoresistive gear tooth sensor further comprises an outer casing.

The present invention has the following advantages:

(1) the sensor element is a MTJ element, which when compared with a Hall Effect sensor, AMR sensor, or GMR element sensor has better temperature stability of the sensor, higher sensitivity, lower power consumption, better linearity, wider linear region, and simpler structure;

(2) the sensor is provided with a concave soft ferromagnetic flux concentrator, that reduces the magnetic field parallel to the sensitive direction of the MTJ element, at the position of the magnetic sensor chip to ensure the MTJ element operates in its linear region, greatly improving sensor performance;

(3) the sensor is a magnetic sensor chip using a gradiometer bridge, so that the sensor is not susceptible to interference from external magnetic interference field in addition to the unwanted sensitive direction biasing effect of the permanent magnet bias field;

(4) In one preferred embodiment the magnetoresistive gear tooth sensor, further comprises a pair of second permanent magnets positioned adjacent to each MTJ element group in order to provide a bias magnetic field for each of the MTJ element groups and perpendicular to the sensing direction of the MTJ element groups. By varying the magnetic bias field on the MD element in this perpendicular direction, it is possible to adjust the saturation field of the MTJ element, thereby obtaining a high sensitivity sensor with sensitivity that can be tuned according to specific needs;

(5) In one preferred embodiment, the MTJ element group is provided with a pair of inclined permanent magnets wherein the MTJ element sits between the pair of permanent magnets, and the magnetic field generated by the permanent magnets is inclined along the sensitive direction of the MTJ elements in order to eliminate the Neel coupling field of the MTJ elements, thereby ensuring the magnetic operating point of the MTJ element is in its linear region, which improves the linearity of the sensor;

(6) In another preferred embodiment, the magnetic bias field is provided by a magnetic layer built on top of the MTJ element free layer, wherein the bias layer provides a magnetic field in the freelayer in a direction perpendicular to the MTJ element sensitive direction. The magnetic bias field from the bias layer on the MTJ element can be varied in order to adjust the saturation field of the sensor, thereby obtaining a high sensitivity sensor wherein the sensitivity can be tuned according to specific needs;

(7) The sensor can be provided with control circuitry used to determine the location of a tooth gear, existence of missing gear teeth, and the location of missing gear teeth;

(8) Moreover, the sensor when so outfitted with appropriate control circuitry is able to determine the velocity of the gear and the direction of movement of the gear;

(9) It may be used for both linear and circular gears;

(10) It may be mass produced at low cost.

BRIEF DESCRIPTION

DESCRIPTION OF THE PREFERRED EMBODIMENTS

The present invention will be further described along with the appended figures implementations that are presented below.

Figure 1:
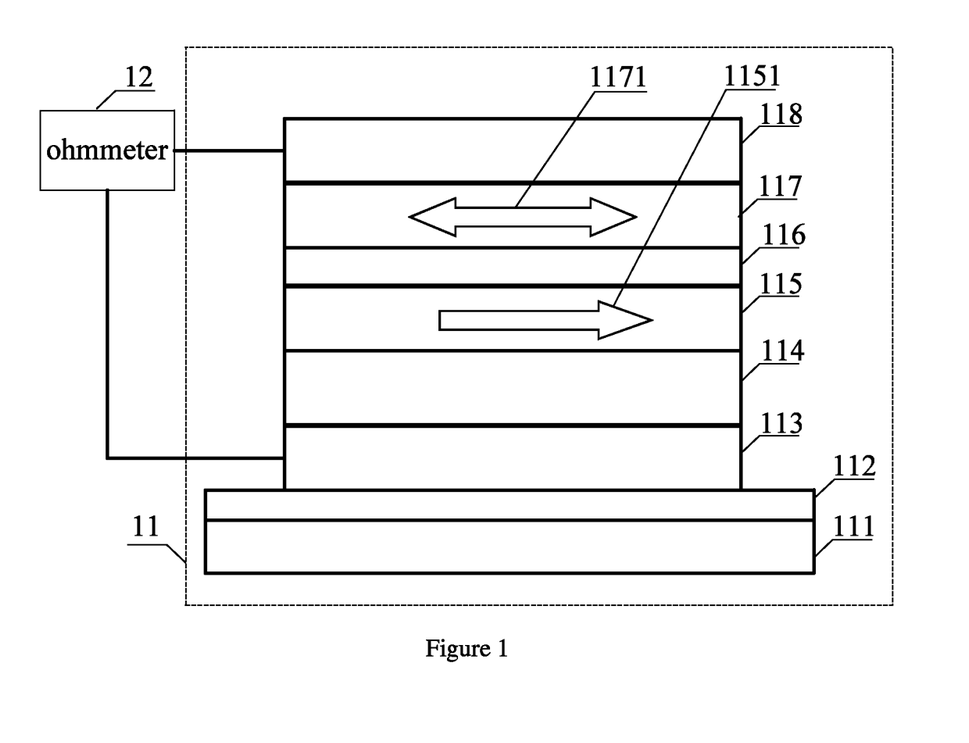
FIG. 1 is a schematic block diagram of an MTJ element.

First Implementation:

FIG. 1 shows a schematic diagram of a first embodiment of an MTJ element 11. The first embodiment of an MTJ element 11 is a multilayer film structure, shown in FIG. 1, which comprises sequentially deposited on the substrate 111, an insulating layer 112, a bottom electrode layer 113, a pinning layer 114, a pinned layer 115, a tunnel barrier layer 116, a ferromagnetic free layer 117, and a top electrode layer 118. Pinned magnetic layer 115 and ferromagnetic free layer 117 are comprised of ferromagnetic metals and alloys including Fe, Co, Ni, FeCo, FeNi, FeCoB, or FeCoNi. The pinned layer 115 may be a trilayer ferromagnetic layer, in which two ferromagnetic layer are separated by a Ru layer, for example, a FeCo/Ru/FeCo trilayer. Pinning layer 114 and pinned layer 115 are exchange coupled so that the direction of the magnetic moment 1151 of the pinned layer 115 is rigidly fixed in one direction, and the presence of external magnetic field $H_{apply}$ does not change the direction of magnetic moment 1151. Pinning antiferromagnetic layer 114, may be comprised of various materials including PtMn, IrMn or FeMn. The tunnel barrier layer 116 material may include MgO or $Al_2O_3$. The direction of the magnetic moment 1171 of free layer 117 can change as the direction or magnitude of the external magnetic field $H_{apply}$ changes. Under the influence of an external magnetic field $H_{apply}$, the direction of the magnetic moment 1171 of the free layer 117 can be parallel to the pinned layer 115 magnetic moment 1151 and it can be gradually rotated into to the direction antiparallel to the magnetic moment 1151 of the pinned layer 115, and vice versa. In the present embodiment, the direction of the magnetic moment 1171 of the free layer 117 is defined as the sensitive direction of the first MTJ element 11. Top electrode layer 118 and the bottom electrode layer 113 are generally composed of non-magnetic conductive materials. The substrate 111 material is typically silicon, quartz, pyrex, GaAs, or AlTiC. The area covered by the insulating layer 112 is larger than the area of the bottom electrode layer 113. Top electrode layer 118 and bottom electrode layer 113 are used for electrically connecting MTJ elements to each other and to other components. In the present embodiment, the top electrode layer 118 and the bottom electrode layer 113 are electrically connected to an ohmmeter 12 to measure the resistance of the first MTJ element 11.

The magnetoresistance of the first MTJ element 11 depends on the relative orientation magnetic moments of the free layer 117 and the pinned layer 115. When the direction of the magnetic moment 1171 of the free layer 117 is parallel to the direction of the magnetic moment 1151 of the pinned layer 115, the resistance value of the first MTJ element 11 is at its minimum, and the first MTJ element 11 is in the low resistance state; when the magnetic moment 1171 of the free layer 117 is antiparallel to the direction of the magnetic moment 1151 of the pinned layer 115, the resistance value of the first MTJ element 11 is maximum, and first MTJ element 11 is in a high resistance state. Known methods may be used to achieve linear behavior of the first MTJ element's 11 resistance as a function of an external magnetic field $H_{apply}$ response between the high resistance state and the low resistance state.

Figure 2:
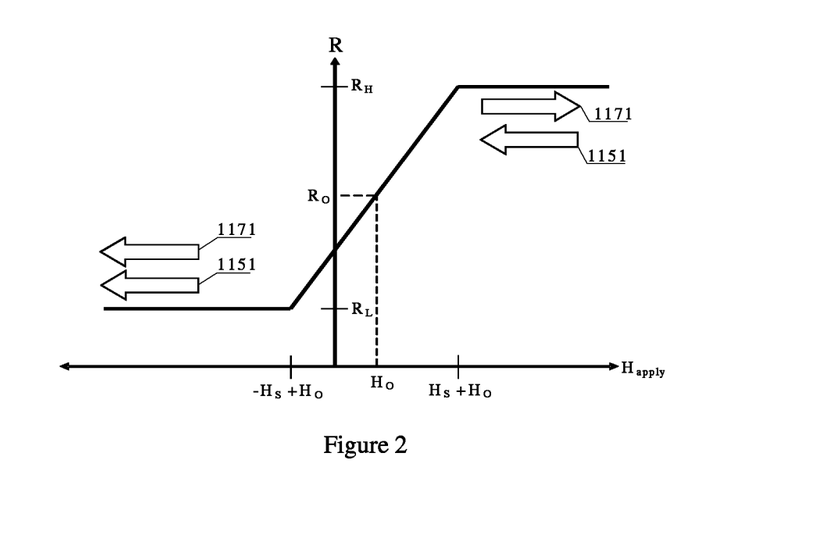
FIG. 2 shows an idealized transfer curve response of the resistance of a MTJ element as a function of $H_{apply}$, where the external magnetic field $H_{apply}$ is applied along the sensitive direction of the MTJ element.

An idealized drawing of the external magnetic field $H_{apply}$ dependence of the resistance of MTJ element 11 is shown in FIG. 2, where the external magnetic field $H_{apply}$ is applied along the sensitive direction of first MTJ element 11. When the first MTJ element 11 is in the low resistance state or a high resistance state, the response curve reaches saturation. The MTJ element 11 resistance value in the low resistance state is denoted as $R_L$; the resistance value in a high resistance state of the MTJ element 11 is denoted as $R_H$. Between the high resistance state and the low resistance state, the resistance of MTJ element 11 denoted R, changes linearly with the external magnetic field $H_{apply}$. The slope of the resistance curve of the first MTJ element 11 R as a function of magnetic field $H_{apply}$, that is the rate of change of the resistance value R of the first MTJ element 11 with the external magnetic field $H_{apply}$ is called the sensitivity of the MTJ element 11. FIG. 2 shows the first MTJ resistance response curve of the external magnetic field $H_{apply}$ element 11 is not on the straight line $H_{apply}=0$ and not axisymmetric, but about $H_{apply}=H_o$. It is offset by amount $H_O$. $H_O$ is often called the Neel coupling field. Typically, Ho is the range of 1-40 Oe.

The resistance R in the linear region of the response curve shown in FIG. 2 of the first MTJ element 11 can be approximated as:

$$R = \frac{R_H - R_L}{2H_s}(H - H_o) + \frac{R_H + R_L}{2} \quad (1)$$

Figure 3:
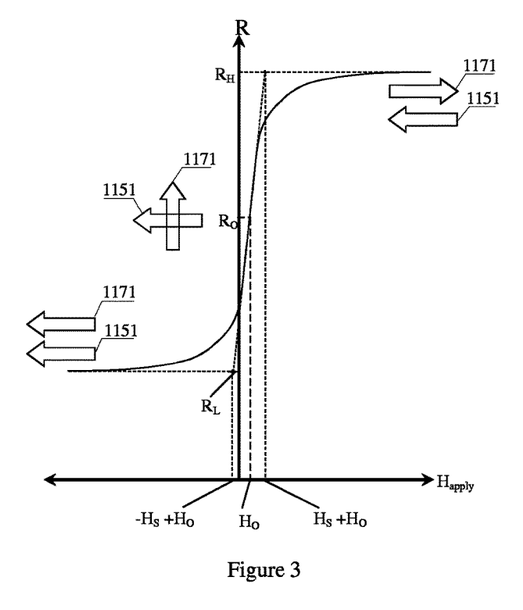
FIG. 3 shows a more realistic plot of the resistance of an MTJ element as a function of external magnetic field $H_{apply}$, when the external magnetic field $H_{apply}$ is aligned along the sensitive direction of the MTJ element.

In formula (1), $H_s$ represents the saturation field, $H_s$ is defined as follows: assuming the Neel coupling field $H_o=0$ then the tangent line of the resistance vs. $H_{apply}$ curve of the MTJ element 11 intersects the saturated resistance at the positive saturation field and the negative resistance saturation value at the negative saturation field value. In an ideal state, the variation of R of the first MTJ element 11 with the external magnetic field $H_{apply}$ is perfectly linear, and there is no hysteresis. In practice however, an MTJ element 11 usually has some small hysteresis, and the resistance response curve as a function of $H_{apply}$ of the first MTJ element 11 is more closely approximated by a curve as shown in FIG. 3. This is due to the magnetic material, and the resistive response to the external magnetic field of the first MT' element 11 is more curved.

Figure 4:
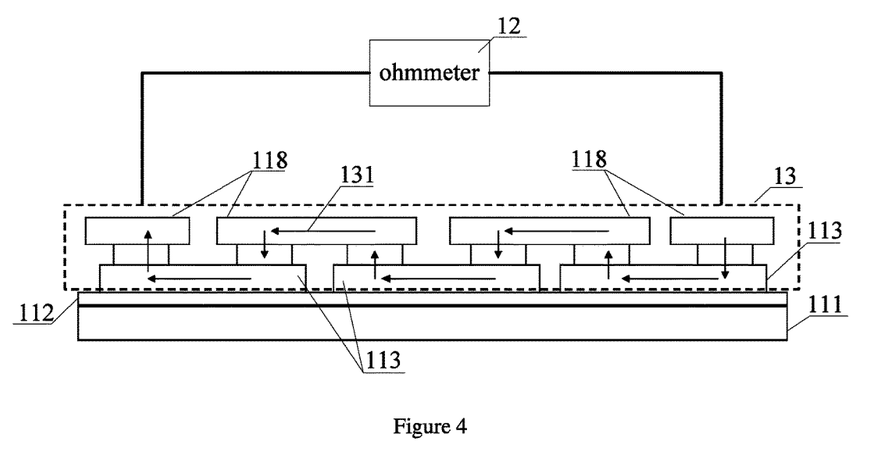
FIG. 4 illustrates one manner in which MTJ elements may be interconnected in series.

In many applications, there will be a plurality of magnetoresistive MTJ elements 11 connected in series, parallel, or a combination of series and parallel as an MTJ element group. In the present embodiment, the MTJ element group 13 is composed of six MTJ elements 11 connected in series, as shown in FIG. 4, and within the MTJ element group 13, the set of six MTJ elements 11 have the same sensing direction 1171. MTJ element group 13 is electrically connected to other components, such as for example an ohm-meter 12. A current 131 flows through the MTJ element group 13, and the path of the current 131 is shown in FIG. 4. Typically, the direction of current 131 does not affect the resistance value of the Mil element group 13. The resistance value may be changed by changing the number of MTJ element MTJ elements 11 in the MTJ element group 13. A single MTJ element group 13 alone may serve as a bridge arm of a sensor bridge, or a plurality of MTJ element groups 13 may be interconnected within the same arm in series, parallel, or a combination thereof to form a bridge arm with appropriate resistance.

Figure 5:
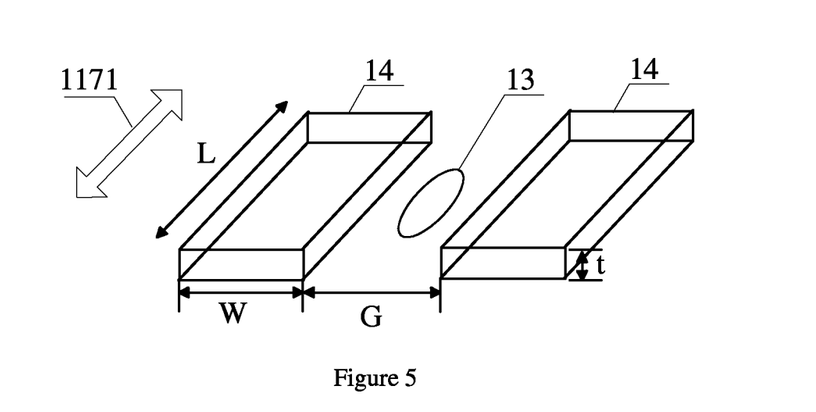
FIG. 5 is a schematic diagram of a set of permanent magnets at the sides of a MTJ element.
Figure 6:
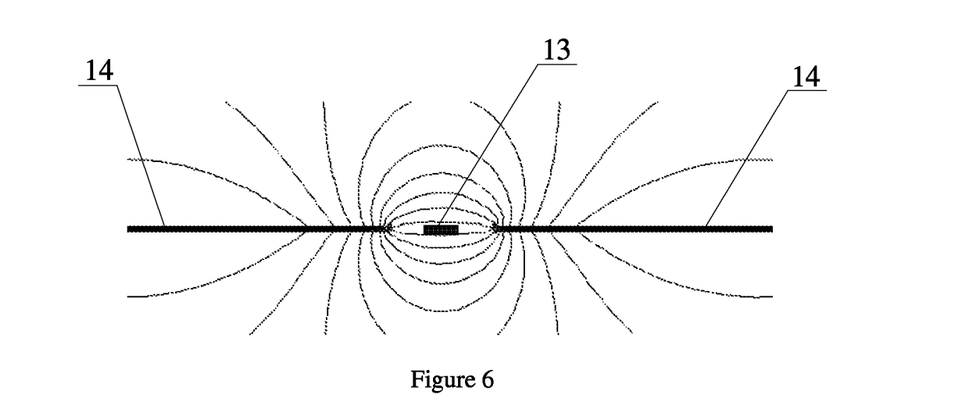
FIG. 6 is a cross-sectional view of a pair of permanent magnets showing the magnetic field distribution around the MTJ element.
Figure 7:
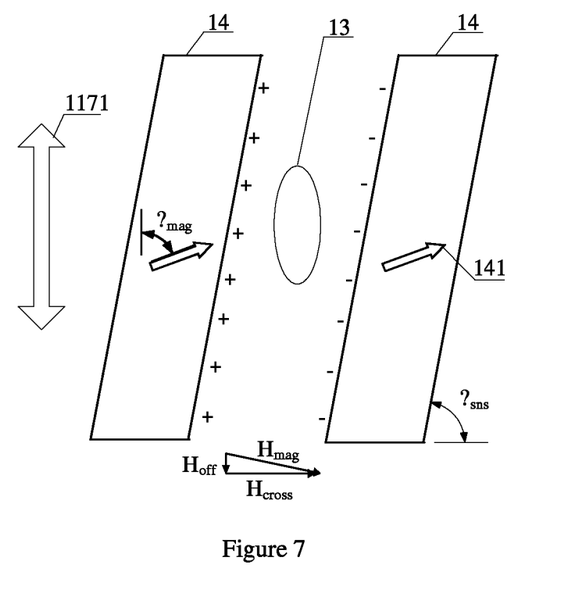
FIG. 7 shows a pair of inclined permanent magnets around an MTJ element.

In order to provide the element 11 or MTJ element group 13 with a bias magnetic field $H_{cross}$, and eliminate its Neel coupling field $H_o$, permanent magnets 14 can be set on both sides of an MTJ element 11 or group 13, and the permanent magnets 14 may be tilted. In the present embodiment, as shown in FIG. 5 permanent magnets 14 are placed on both sides of the first MTJ element group 13, and the permanent magnets 14 are tilted relative to the sensitive direction 1171 of the MTJ element group 13. The magnetic field distribution of the permanent magnet 14, in the vicinity of the first MTJ element group 13 is shown in FIG. 6. In the present embodiment, the permanent magnet 14 is a rectangular parallelepiped shape. As shown in FIG. 7, there is an angle between the permanent magnets long side 14 and the sensitive axis 1171 of the MTJ element 13, and this angle is denoted $\theta_{sns}$. Each permanent magnet 14 has a specific length L, width W, and thickness t, and there is gap G between the two permanent magnets 14, and these physical metrics are used to set the bias field value.

The magnetic field $H_{mag}$ between the two permanent magnets 14 in the gap can be considered to be due to virtual magnetic charges ($\rho_s$) that form at the edge of the permanent magnet plates, and $H_{mag}$ also depends on the shape and orientation of the plates. As shown in FIG. 7, the angle defined between the permanent magnets' remanent magnetization $M_r$ 141 and the sensitive direction of the of the MTJ element group 11 is tilted at an angle $\theta_{mag}$. $\rho_s$ magnetic charge density forms at the edge of the permanent magnet 14 as a function of the magnitude of remanent magnetization $M_r$ 141, the orientation angle $\theta_{mag}$ 141, as well as the inclination angle $\theta_{sns}$ of the permanent magnet 14. At the edge of the permanent magnet 14 magnetic charge density $\rho_s$ can be expressed as:

$$\rho_s = M_r \cos(\theta_{mag} + \theta_{sns}) \quad (2)$$

The magnetic field $H_{mag}$ emanating from the edge of the permanent magnet 14 can be expressed as:

$$\vec{H}_{mag}(\vec{r}) = 4\pi \int_{Surface} \frac{\rho_s}{(\vec{r} - \vec{r}')^2} dS' \quad (3)$$

As shown in FIG. 7, the magnetic emanating from the edge of the permanent magnet 14, $H_{mag}$ has a component 13 perpendicular to the sensitive axis direction 1171, and it is defined as a bias magnetic field $H_{cross}$ of the MTJ element group. When $\theta_{mag} = \theta_{sns} = \pi/2$, the bias magnetic field $H_{cross}$ can be expressed as:

$$H_{cross} = -8M_r \left( \alpha \tan \left( \frac{Lt}{\left(\frac{W}{2} - \frac{G}{2}\right)\sqrt{L^2 t^2 \left(\frac{W}{2} - \frac{G}{2}\right)^2}} \right) + \right. \quad (4)$$

$$\left. \alpha \tan \left( \frac{Lt}{\left(\frac{W}{2} + \frac{G}{2}\right)\sqrt{L^2 t^2 \left(\frac{W}{2} + \frac{G}{2}\right)^2}} \right) \right)$$

Using formula (4) it can be seen that by adjusting the shape of the two permanent magnets 14, the gap size G between the two, and the orientation and size of the remanent magnetization $M_r$ 141, it is possible to change the bias magnetic field $H_{cross}$ at the location of the MTJ element group 13. By varying the bias magnetic field $H_{cross}$ it is possible to adjust the saturation field of the MTJ element group 13, thereby setting the sensitivity of the MTJ element group 13.

The bias magnetic field $H_{cross}$ can also be expressed as:

$$H_{cross} = H_{mag} \sin \theta_{mag} \quad (5)$$

The magnetic field emanating from the edge of permanent magnet 14 generates a magnetic field component $H_{off}$ along the sensitive direction 1171 of the MTJ element group 13. The $H_{off}$ component 1171 can be expressed as:

$$H_{off} = H_{mag} \cos \theta_{mag} \quad (6)$$

As can be seen from formula (6), by adjusting the shape, size, residual magnetization $M_r$, and the inclination angle $\theta_{mag}$ 141 of the permanent magnets 14, it is possible to change the magnetic field $H_{mag}$ generated by the permanent magnets 14 at the location of the MTJ element 13 along the sensitive direction to produce component $H_{off}$ in order to eliminate the Neel coupling field $H_o$ of the MTJ element 11 to ensure that the operating point of the MTJ element 11 is in its linear region.

Figure 8:
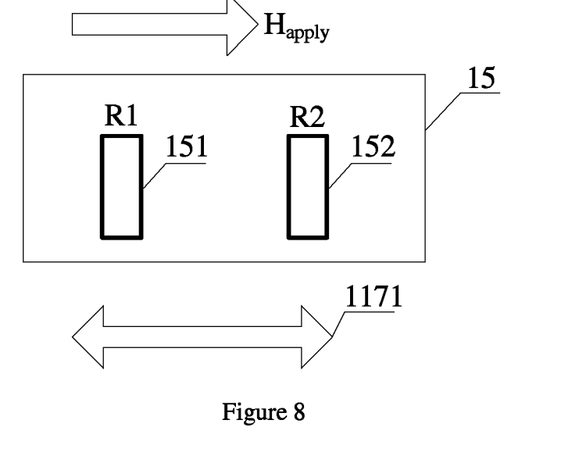
FIG. 8 is a top-down view showing the physical location of the half-bridge sensor elements.
Figure 9:
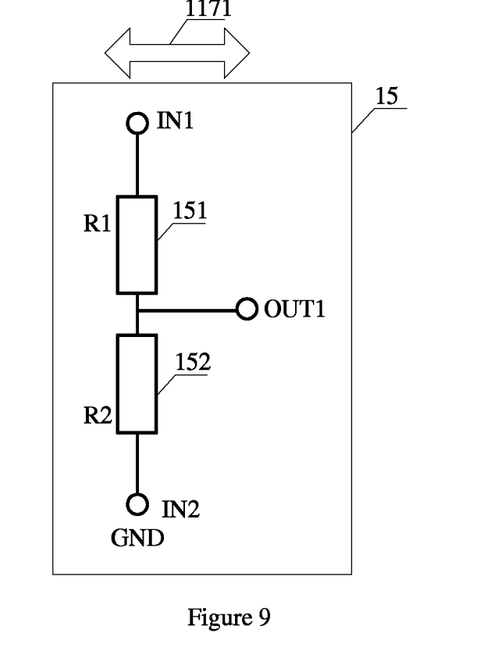
FIG. 9 is an equivalent circuit diagram of the half-bridge as shown in FIG. 8.

FIG. 8 is a top view of the physical location of the half-bridge 15 sensor arms in the XY plane. FIG. 9 is an equivalent circuit diagram of half bridge 15. Half-bridge 15 includes two bridge arms 151 and 152, the two bridge arms may be comprised of MTJ element groups 13, and the resistance of the two bridge arms, respectively, may be denoted, R1 and R2, Bridge arm 151 and arm 152 have sensitive direction along the same sensitive direction 1171. As shown in FIG. 8, at bridge arm 151 and bridge arm 152 the external magnetic field strength $H_{apply}$ for both sensors is applied along the same sensitive direction 1171 and it can have different magnitude at each arm. The permanent magnets 14 on both sides of the arm 151 and the arm 152 are tilted. Two input terminals IN1 and IN2 are provided half-bridge 15, and input terminal IN2 may be grounded. The half-bridge 15 is denoted as OUT1. When a steady bias voltage $V_{bias}$ is applied between the input terminal IN1 and the input terminal IN2, then when the field on arms 151 and 152 changes, the resistance value of the resistance values of R1 and R2 change differently, producing an output voltage signal of the output terminal $V_{OUT1} = V_1$.

Figure 10:
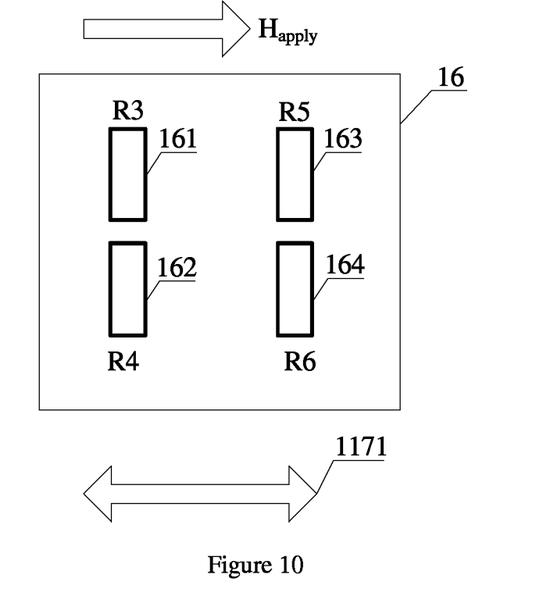
FIG. 10 is a top view of the physical location of the sensors in full-bridge.
Figure 11:
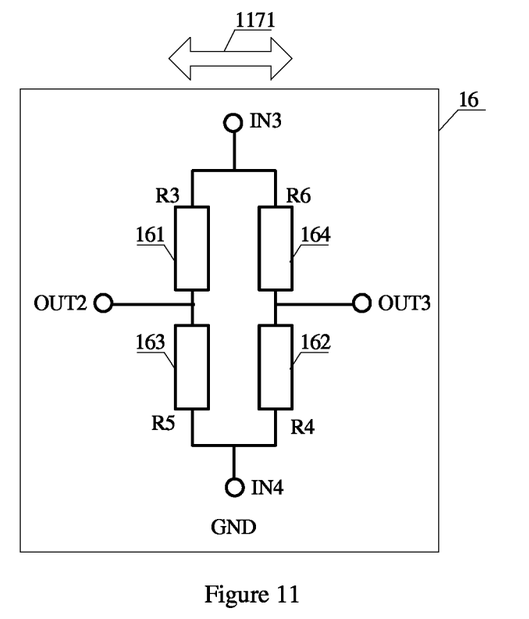
FIG. 11 is an equivalent circuit diagram of the full bridge of FIG. 10.

FIG. 10 is a top view showing the physical location of sensor arms in a full-bridge 16. FIG. 11 shows the equivalent circuit diagram for the full bridge 16. Full-bridge 16 comprises four arms 161, 162, 163 and 164, and each of the arms may comprise MTJ element group 13, the resistance values of the four arms of the bridge are denoted as R3, R4, R5, and R6. Bridge arm 161, arm 162, arm 163 and arm 164 are sensitive along the same direction 1171. Application of a gradient magnetic field $H_{apply}$ along the sensitive direction 1171 changes the output. As shown in FIG. 10 different values of magnetic field strength of the external magnetic field $H_{apply}$ may exist at the location of bridge arms 161, 162, 163, 164. Each bridge arm 161, 162, 163 and 164 is respectively provided with a pair of inclined permanent magnets 14. Two input terminals of the full bridge 16, are denoted respectively IN3 and IN4, where input terminal IN4 may be connected to ground. The full-bridge 16 has two outputs OUT2 and OUT3 respectively. When applying a steady bias voltage of value $V_{bias}$ to the bridge, bridge arm resistance R3 of arm 161 or R4 of arm 162 change, and bridge arm resistance R5 of arm 163 or bridge arm resistance R6 of arm 164 thus have different values, such that output OUT2 and output OUT3 produce voltages V2 and V3 respectively, and the full-bridge 16 will produce a differential output voltage signal of $V_{OUT2}=(V3-V2)$.

Ideally, full-bridge 16 output signal $V_{OUT2}$ has no response to a common mode magnetic field $H_{cM}$, but large response to differential-mode magnetic field $H_{dM}$. In the presence of a common mode magnetic field $H_{cM}$, arm 161, arm 162, arm 163, and arm 164 have the same resistance value, so the full-bridge 16 outputs zero voltage signal. Ideally, the resistance values of the four full-bridge 16 arms in the absence of an applied magnetic field are equal to R, i.e., R3=R4=R5=R6=R, and four full-bridge 16 arms have equal sensitivity of S, that is, $S_{R3}=S_{R4}=S_{R5}=S_{R6}=S_R$, then:

$$V_2 = -\frac{S_{R4} \cdot H_{dM}}{2R_4} V_{bias} = -\frac{S_R H_{dM}}{2R} V_{bias} \tag{7}$$

$$V_3 = \left( \frac{R_6 + S_{R6} H_{dM}}{R_6 + S_{R6} H_{dM} + R_5 - S_{R5} H_{dM}} - \frac{R_6}{R_5 + R_6} \right) V_{bias} = \tag{8}$$

$$\frac{S_{R6} H_{dM}}{R_5 + R_6} V_{bias} = \frac{S_R H_{dM}}{2R} V_{bias}$$

$$V_{OUT2} = V_3 - V_2 = \frac{S_R H_{dM}}{R} V_{bias} \tag{9}$$

Figure 12:
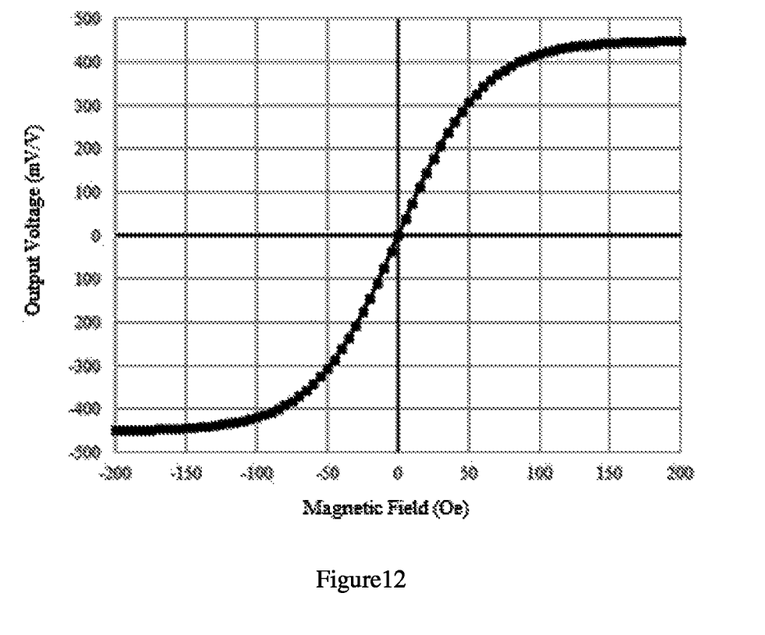
FIG. 12 shows the measured output voltage signal of a full-bridge magnetic field sensor.

As can be seen from the formula (9), full-bridge 16 outputs a voltage signal only in the presence of a differential magnetic field $H_{dM}$, but not to a common mode magnetic field $H_{cM}$. Therefore, the full-bridge 16 has a strong ability to reject common-mode magnetic interference. The typical output response of a full-bridge sensor 16 is shown in FIG. 12.

Figure 13:
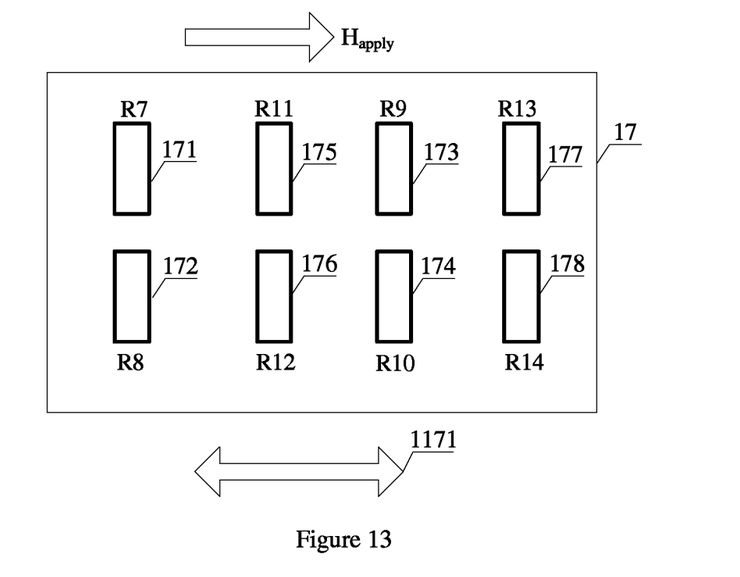
FIG. 13 shows the physical location of the sensor elements of a double full-bridge sensor.
Figure 14:
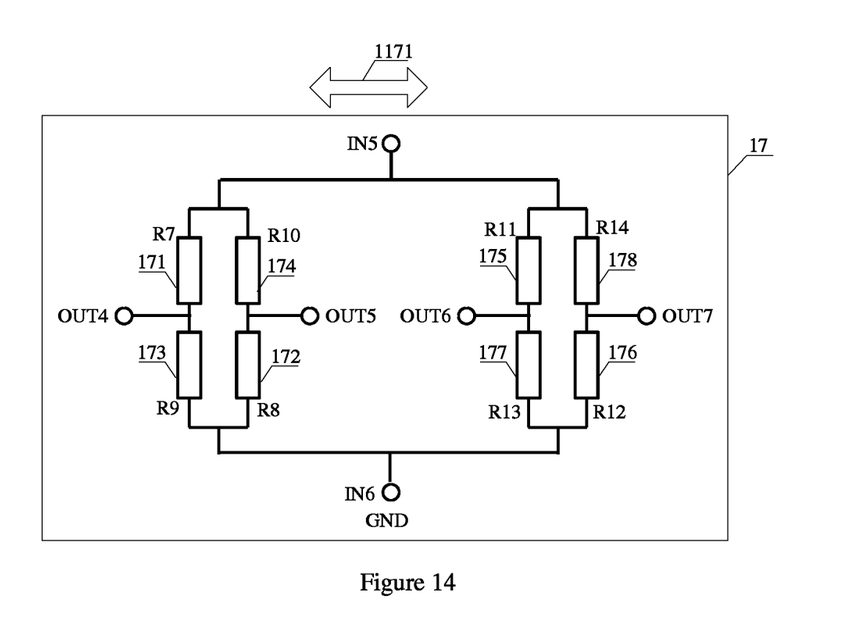
FIG. 14 shows an equivalent circuit diagram of the double full-bridge sensor.

In practical applications, the sensor can use two full-bridges, known as a double full-bridge. FIG. 13 shows a top view of the physical location of the sensor arms in a double full-bridge. FIG. 14 shows an equivalent circuit diagram of the double full-bridge 17. Double full bridge 17 includes eight bridge arms 171, 172, 173, 174, 175, 176, 177 and 178, which may for example comprise comprising at least one MTJ element 111 or a plurality or MTJ elements electrically connected in series, parallel, or a combination of series and parallel, wherein the resistance of the eight bridge arms have values R7, R8, R9, R10, R11, R12, R13 and R14, respectively. FIG. 14, shows an example where arms 171, 172, 173, and 174 form one full bridge, and bridge arms 175, 176, 177, and 178 form a second full bridge. Preferably, the sensitive directions of the 8 bridge arms in the double full-bridge 17 are all the same and aligned along the MTJ element sensitive direction 1171. A gradient magnetic field can produce changes in $H_{apply}$ along the sensitive direction 1171. As shown in FIG. 13, the strength of the external magnetic field $H_{apply}$ at the physical location of the arm 171 and 172 and $H_{apply}$ at the position of the arm 173 and 174 may produce different $H_{apply}$ at those physical locations; and also different magnetic field strength $H_{apply}$ may occur at the location of arms 175 and 176 and at the location of arms 177 and 178. Each arm within the double full-bridge 17 is located between a pair of inclined permanent magnets 14. Two input terminals of the double full bridge 17 respectively are IN5 and IN6, where for example, the input terminal IN6 may be grounded. The four outputs of the double full bridge 17 are OUT4, OUT5, OUT6 and OUT7. Steady $V_{bias}$ voltage is applied between the input terminals IN5 and IN6, The bridge arm resistance pairs R7 of arm 171/R8 of arm 172 and R9 of arm 173/R10 of arm 174 may have different sizes, likewise bridge arm resistance pairs R11 of arm 175/R12 of arm 176 and R13 of arm 177/R14 of arm 178 may have different values s, and then bridge outputs OUT4, OUT5, OUT6, and OUT7 respectively will have different voltages V4, V5, V6, and V7. The double full bridge 17 output voltage signals are then defined as $V_{OUT4}=(V5-V4)$ and $V_{OUT5}=(V7-V6)$.

Figure 15:
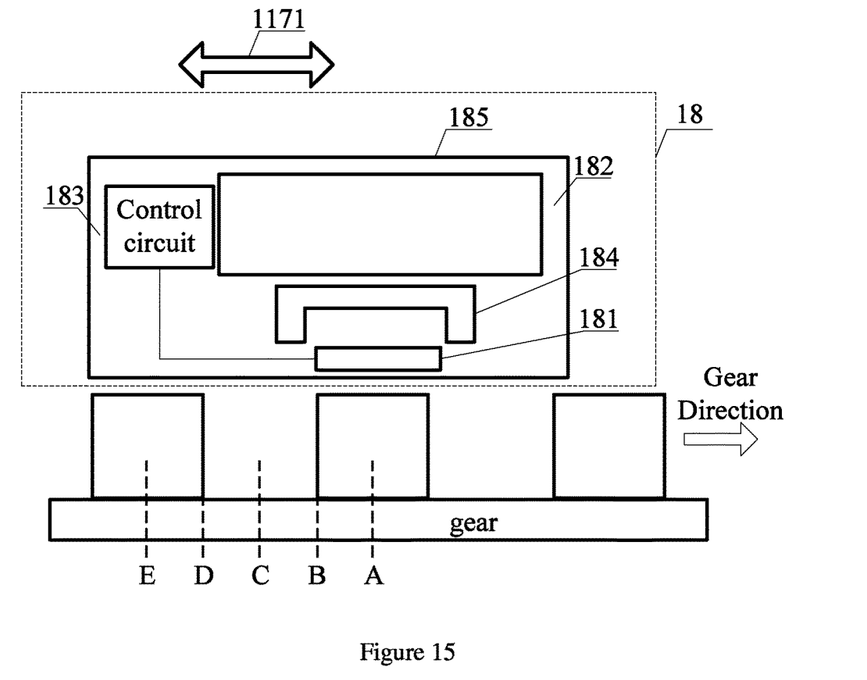
FIG. 15 shows an exemplary construction of a magnetoresistive gear tooth sensor.

When prepared as a magnetoresistive gear tooth sensor, the half-bridge 15, full-bridge 16, or double full-bridge 17 may be deposited on the same substrate using the same deposition process step, and this is often referred to as a single-chip magnetoresistive gear tooth sensor, Alternatively the bridges may be formed from a plurality of dice containing MD element groups 13 after cutting a wafer into dice, and electrically interconnecting the dice via wire bonds to interconnect the MTJ elements 11 of the dice into a bridge. Through this technique, the MTJ element groups may be interconnected to form half bridge 15, full bridge 16, or double full bridge 17 sensors. They can then be packaged as a single magnetoresistive sensor chip and the magnetoresistive sensor can then be connected to an ASIC (Application Specific Integrated Circuit, ASIC) or to a lead frame package pin within a semiconductor package.

FIG. 15 shows an embodiment of the magnetoresistive gear tooth sensor 18 including a magnetic sensor chip 181, a permanent magnet 182, a control circuit 183, a soft ferromagnetic flux concentrator 184, and a housing structure 185. The magnetic sensor chip 181, the permanent magnet 182, the control circuit 183, and the soft magnetic flux concentrator 184 are integrated into the housing 185. The magnetic sensor chip 181 includes at least one bridge, the bridge may be a half-bridge 15, full bridge 16 or a double full-bridge 17, where half-bridge 15, and each of the full-bridge 16, or double full-bridge 17 comprises at least a first MTJ element group 13, said MTJ element group 13 includes a plurality of MTJ elements 11 connected in series, parallel, or a combination of series and parallel. The magnetic sensor chip 181 is electrically connected to control circuit 183. The soft ferromagnetic flux concentrator 184 is disposed between the magnetic sensor chip 181 and the permanent magnet 182, such that the concave opening 184 of the soft ferromagnetic flux concentrator points in the direction of the magnetic sensor chip 181. In the preferred version of the present embodiment, the magnetic sensor chip 181 includes a double full-bridge 17, each bridge arm of the double full-bridge 17 includes at least one MTJ element group 13. The permanent magnets 182 for generating an external magnetic field $H_{apply}$ are used to magnetize the ferromagnetic gear. The soft ferromagnetic flux concentrator 184 reduces the magnetic field $H_{apply}$ of permanent magnet 182 along the sensitive direction 1171 of the magnetic sensor chip 181 in order to ensure the MTJ elements 11 operate in their linear operating region. When relative movement occurs between the gear and the magnetic sensor chip 181, the magnetic field strength of the external magnetic field $H_{apply}$ for a position where the magnetic sensor chip 1811 will change. Changes in the magnetic field strength detected by the magnetic sensor chip 181 can be used to transform the external magnetic field $R_{apply}$ into a control signal for the control circuit 183. The control circuit 183 processes the output signal of the magnetic sensor chip 181. In the present embodiment, the control circuit 183 can transform the sinusoidal voltage signal voltage of the magnetic sensor chip 181 into a square wave form.

Figure 16:
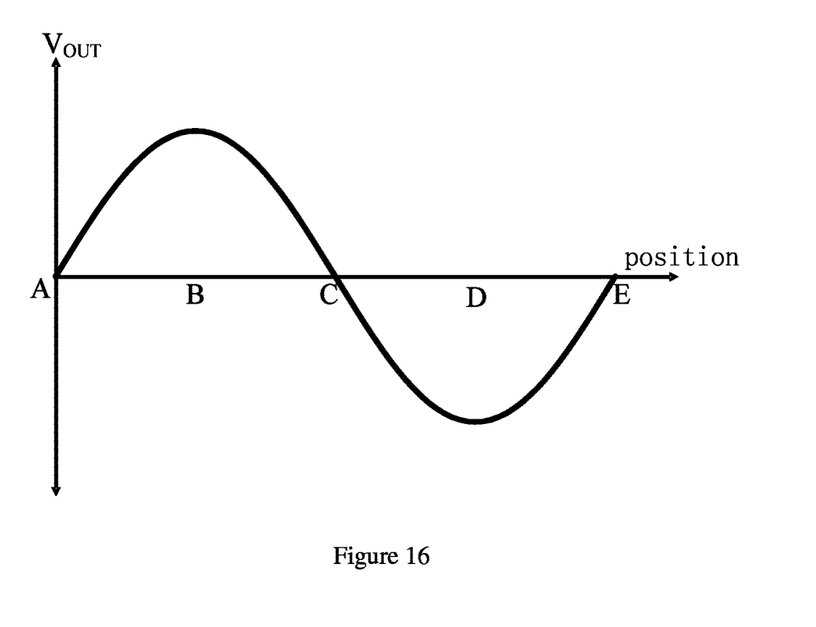
FIG. 16 is a schematic diagram of the sine wave voltage signal of the magnetoresistive gear tooth sensor in Example 1.
Figure 17:
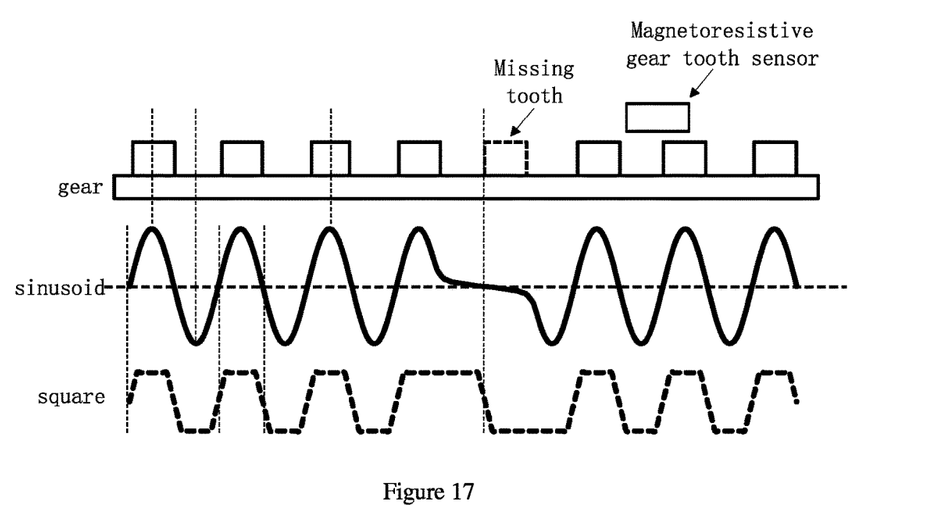
FIG. 17 is a schematic drawing showing the effect of missing gear teeth on the output voltage waveform of the magnetoresistive gear tooth sensor.
Figure 18:
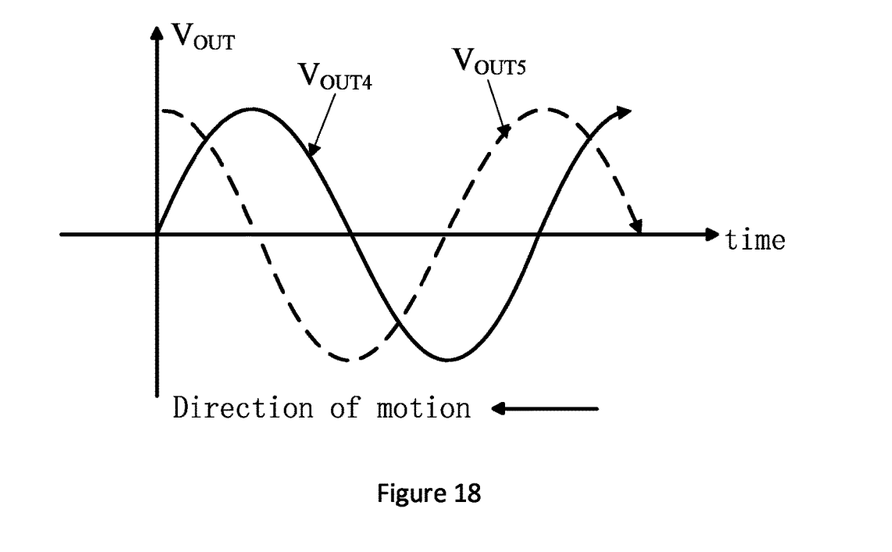
FIG. 18 is a schematic diagram of the output waveforms of a magnetoresistive gear tooth sensor with dual full bridge.

In the present embodiment, the magnetoresistive sensor gear tooth sensor 18 may be stationary, and sitting above a gear, as shown in FIG. 15. When different gear positions at points A, B, C, D, and E sequentially pass by the magnetoresistive gear tooth sensor, the magnetoresistive gear tooth sensor 18 outputs a sine wave voltage signal shown in FIG. 16. The magnetorestive gear tooth sensor 18 sine wave varies dependent on the location near the above described signal points, and the relationship can be used to determine the position of a gear tooth. When a missing gear tooth passes by the sensor, a sine wave voltage signal or a square wave voltage signal of the magnetoresistive gar tooth sensor 18 output gear may appear as shown in FIG. 17. Examination of the magnetoresistive gear tooth sensor 18 sine or square output voltage waveform shows it can be used to determine whether or not a gear tooth is missing. If a gear tooth is missing, its position can be determined according to the specific location of in the sinusoidal or square wave waveform of the magnetoresistive gear tooth signal where the signal transition length changes. Because the magnetoresistive gear tooth sensor 18 of the present embodiment can use double full-bridge 18 chips 181, magnetoresistive gear tooth sensor 18 can have two voltage output signal $V_{OUT4}$ and $V_{OUT5}$, as shown in FIG. 18. By using the phase difference of the voltage signals $V_{OUT4}$ and $V_{OUT5}$ it is possible to determine the direction of movement of the gear. In this implementation of a magnetoresistive gear tooth sensor 18, at the position of the magnetic sensor chip 181, permanent magnet 18 produces $H_{apply}$ which can be considered as common-mode. Since the magnetic sensor chip 181 with double full-bridge 17 and other bridges have strong common mode suppression of magnetic interference, the resulting magnetoresistive gear tooth sensor 18 is not susceptible to interference from external magnetic field $H_{apply}$ or the field generated by the biasing permanent magnets 182.

Figure 19:
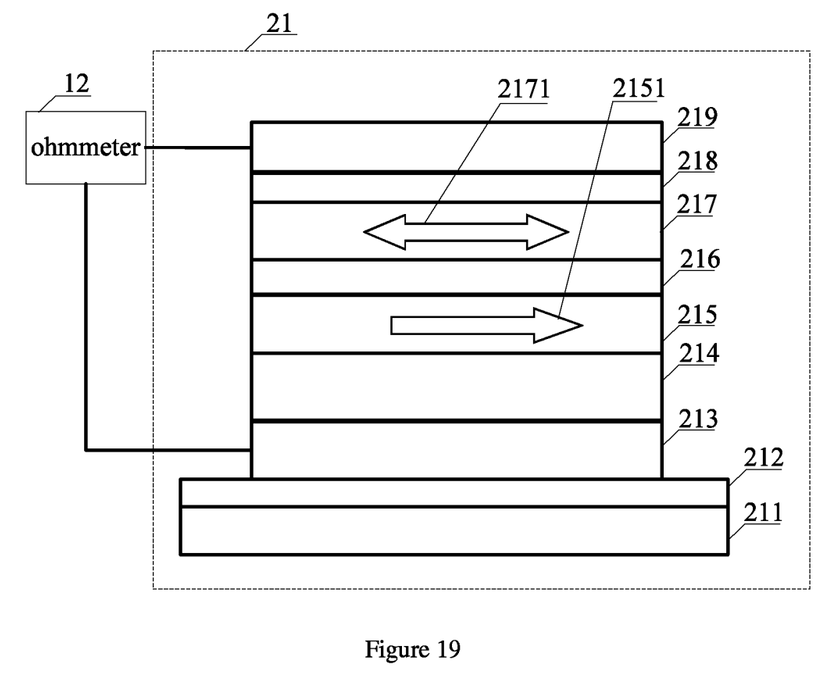
FIG. 19 is a second MTJ element embodiment including a magnetic biasing layer on top of the freelayer.

Second Implementation:

FIG. 19 is a schematic diagram of an implementation of a second type of MTJ element 21. The second MTJ element implementation 21 is a multilayer film structure, as shown in FIG. 19, which comprises sequentially deposited on the substrate 211, an insulating layer 212, a bottom electrode layer 213, a pinning layer 214, a pinned layer 215, a tunnel barrier layer 216, a magnetic free layer 217, a biasing layer 218, and a top electrode layer 219. Pinned layer 215 and freelayer 217 are composed of ferromagnetic materials. Exemplary ferromagnetic materials for the pinned layer 215 and the free layer 217 include Fe, Co, Ni, FeCo, FeNi, FeCo or FeCoNi. The pinned layer 215 may be a single ferromagnetic layer, or a composite layer with a thin Ru layer, for example, a trilayer of FeCo/Ru/FeCo. The pinning antiferromagnetic layer 214, may be composed of various materials including PtMn, IrMn or FeMn. Pinning layer 214 and the pinned layer 215 are exchange coupling such that the pinned layer 215 has its magnetic moment 2151 rigidly fixed in one direction, such that under the influence of an external magnetic field $H_{apply}$ 215 its orientation remains unchanged. The tunnel barrier layer 216 may be made of MgO or $Al_2O_3$. The direction of the magnetic moment 2171 of the free layer 217 can change as the external magnetic field $H_{apply}$ direction changes. Under the influence of an external magnetic field $H_{apply}$, the direction of the magnetic moment 2171 of the free layer 217 can be parallel to the direction of the magnetic moment 2151 of the pined layer 215, and it can gradually change with respect to the magnetic moment 2151 of the pinned layer into antiparallel orientation, and vice versa. Bias layer 218 may be an antiferromagnetic layer or a permanent magnet layer. Biasing layer 218 can be exchange coupling to the magnetic free layer 217 so that the bias magnetic layer 218 can provide a bias field perpendicular to the sensitive direction of the MTJ element 21, $H_{cross}$ 217. By varying the bias magnetic field $H_{cross}$ it is possible to adjust the saturation field of the MTJ element 21, thereby adjusting the sensitivity of the MTJ element 21. When the bias layer 218 is an antiferromagnetic layer plus spacer layer, the Blocking Temperature is lower than that of the pinning layer 214. Between the free magnetic layer 217 and the biasing layer 218 an isolating spacer layer may be deposited in order to attenuate the bias magnetic field $H_{cross}$ from bias layer 218. By changing the thickness of the spacer layer it is possible to adjust the size of the magnetic bias field $H_{cross}$. The isolation layer is generally a non-magnetic material such as Ta, Ru, or Cu. The top electrode layer 219 and the bottom electrode layer 213 are generally non-magnetic conductive material. The substrate 211 is typically made of silicon, quartz, pyrex, GaAs, or AlTiC. The area of the insulating layer 212 is greater than the area of the bottom electrode layer 213. The top electrode layer 219 and the bottom electrode layer 213 are used for electrically connecting with the other elements.

In actual applications, a plurality of the second MTJ elements 21 may be used, and said plurality may involve series, parallel, or a combination of series and parallel connections to a second MTJ element group 23. In the present embodiment, the second MTJ element group 23, comprises groups of four MTJ elements 21 connected in series, wherein each has the same sensitive direction. The group 23 of second type of MTJ elements 21 may be electrically connected ohmmeter 12 or with the other components. The second MTJ element group 23 may be used as an arm of a bridge, and it can also be interconnected with multiple second MTJ element groups 23 in series, parallel, or a combination of series and parallel to form abridge arm. When used in a bridge MIT element group 23, does not need permanent magnets 14 disposed on the sides of the MTJ element groups 23. In this embodiment, the half-bridge 15, full bridge 16, and the double full-bridge 17 the bridge arms do not need permanent magnets 14 disposed around the sides of the MTJ element group 23. In this example, the half-bridge 15, full-bridge 16, and double-full bridge 17 use the second type of Mil element group 23.

The magnetoresistive gear tooth sensor 18 described with element group 23 can be implemented similarly to the first implementation.

The magnetorestive gear tooth sensor described above using MTJ element as the sensitive elements, when compared with those using Hall Effect, AMR, or GMR elements, has better temperature stability, higher sensitivity, lower power consumption, better linearity, wider linear working field range, and has a simpler structure. The disclosed sensor has a concave soft ferromagnetic flux concentrator, a permanent magnet to reduce the external magnetic field along the sensitive direction of MTJ elements ensuring the MTJ element in magnetic sensor chip has a wide liner working range and improving the performance of the sensor. The disclosed sensor's magnetic sensor chips are bridges, making the sensor insusceptible to common mode magnetic field of permanent magnet or magnetic field interference. In optimal implementation, the MTJ element are surrounded by a pair of tilted permanent magnets, where the magnetic field generated by the pair of tilted of the permanent magnet in the direction perpendicular to the MTJ element sensitive direction provides the MTJ element with a magnetic bias field. The magnitude of the bias field can be used to adjust the sensitivity of the MTJ element according to application needs. In one preferred embodiment, the MTJ elements are placed between a pair of inclined permanent magnets, the permanent magnets produce a magnetic field component along the sensitive direction in order to eliminate the Neel coupling field, thereby ensuring the MTJ element operates in its linear region, improving the linearity of the sensor. In another preferred embodiment, a bias layer is deposited above the free layer and the bias layer can provide a bias field perpendicular to the sensitive direction of the MTJ element's free layer. By varying this bias field, the MTJ element saturation field can be adjusted to optimize the sensor, thereby obtaining a sensor with high sensitivity, which can be tuned according to different needs. The magnetoresistive gear tooth sensor can determine the position of the teeth of a gear, or when a gear tooth is missing. It likewise can determine the velocity of motion of a gear, and it can determine the direction of movement of a gear. It may be used with linear or circular gears. The disclosed implementations are conducive to low-cost mass production.

It should be understood that the detailed description of the present invention provides only preferred embodiments, which are intended to be illustrative and not restrictive. Those of ordinary skill in the art upon reading the present specification can produce modified embodiments based on the present technical details described herein, wherein a portion of the technical features may be modified or replaced, but such modifications or replacements do not deviate from the spirit and scope of the technical program.

The invention claimed is:

1. A magnetoresistive gear tooth sensor, comprising:
a first permanent magnet and a sensor chip that includes at least one sensor bridge, wherein each arm of the sensor bridge is comprised of at least one magnetic tunnel junction (MTJ) element group, wherein each MTJ element group is comprised of at least one magnetoresistive MTJ element having a sensitive direction; and
a soft ferromagnetic flux concentrator with a U-shaped slot placed between the first permanent magnet and the sensor chip such that the slot is located on the side of the soft ferromagnetic flux concentrator facing the sensor chip, wherein the soft ferromagnetic flux concentrator is configured to reduce a magnetic field parallel to the sensitive direction to ensure the MTJ element operates in a linear region,
wherein the magnetoresistive gear tooth sensor is configured to generate a bias magnetic field ($H_{mag}$) across each MTJ element group in an oblique direction with respect to the sensitive direction such that, for each MTJ element group, the oblique direction of $H_{mag}$ provides a first component perpendicular to the sensitive direction of the MTJ element group to set a sensitivity of the MTJ element group, and provides a second component parallel to the sensitive direction to cancel a Neel coupling field $H_0$ of the MTJ element group to also ensure the MTJ element operates in a linear region.

2. The magnetoresistive gear tooth sensor of claim 1, wherein each arm of the sensor bridge comprises a multiplicity of MTJ element groups interconnected in series, parallel, or a combination of series and parallel.

3. The magnetoresistive gear tooth sensor of claim 2, wherein the multiplicity of interconnected MTJ element groups has the same sensing direction.

4. The magnetoresistive gear tooth sensor of claim 1, wherein the MTJ element groups within each arm of the sensor bridge have the same sensing direction.

5. The magnetoresistive gear tooth sensor of claim 1, wherein the sensor chip comprises a full bridge, a half bridge, or two full bridges wired as a gradiometer.

6. The magnetoresistive gear tooth sensor of claim 1, wherein more than one magnetoresistive MTJ elements is interconnected in series, parallel, or a combination of series and parallel.

7. The magnetoresistive gear tooth sensor of claim 1, wherein a plurality of magnetoresistive MTJ elements with the same sensing direction connected in series, parallel or a combination of series and parallel.

8. The magnetoresistive gear tooth sensor of claim 1, wherein the magnetoresistive MTJ element is comprised of a multilayered structure with the following sequence: a pinning layer, a ferromagnetic pinned layer, a tunnel barrier, and a ferromagnetic free layer.

9. The magnetoresistive gear tooth sensor of claim 1, wherein the magnetoresistive gear tooth sensor includes a pair of second permanent magnets positioned around each MTJ element group to provide the bias magnetic field for each MTJ element group.

10. The magnetoresistive gear tooth sensor of claim 9, wherein the pair of second permanent magnets is positioned on both sides of each MTJ element group obliquely with respect to the sensing direction of the corresponding MTJ element group.

11. The magnetoresistive gear tooth sensor of claim 9, wherein the pair of the second permanent magnets have a magnetization set at an angle to provide the first and second components.

12. The magnetoresistive gear tooth sensor of claim 1, wherein the magnetoresistive MTJ element is comprised of a multilayered structure with the following sequence: a pinning layer, a ferromagnetic pinned layer, a tunnel barrier, a ferromagnetic free layer, and a magnetic bias layer.

13. The magnetoresistive gear tooth sensor of claim 12, wherein the magnetoresistive MTJ elements further include an isolation layer deposited between the magnetic free layer and the magnetic bias layer.

14. The magnetoresistive gear tooth sensor of claim 1, further comprising a microcontroller electrically interconnected with the sensor bridge.

15. The magnetoresistive gear tooth sensor of claim 14, wherein the microcontroller is used to determine the position of a gear tooth according to a relationship between the position of the gear tooth and the voltage signals of the magnetoresistive gear tooth sensor.

16. The magnetoresistive gear tooth sensor of claim 14, comprising two full sensor bridges, wherein each arm of the two full sensor bridges includes a MTJ element group, and the microcontroller is used to determine the movement direction of a gear using the voltage output of the magnetoresistive gear tooth sensor.

17. The magnetoresistive gear tooth sensor of claim 1, further comprising an outer casing.

18. A magnetoresistive gear tooth sensor, comprising:
a first permanent magnet and a sensor chip that includes at least one sensor bridge, wherein each arm of the sensor bridge is comprised of at least one magnetic tunnel junction (MTJ) element group, wherein each MTJ element group is comprised of at least one magnetoresistive MTJ element having a sensitive direction;

a soft ferromagnetic flux concentrator with a U-shaped slot placed between the first permanent magnet and the sensor chip such that the slot is located on the side of the soft ferromagnetic flux concentrator facing the sensor chip, wherein the soft ferromagnetic flux concentrator is configured to reduce a magnetic field parallel to the sensitive direction to ensure the MTJ element operates in a linear region; and a pair of second permanent magnets positioned around each MTJ element group in order to provide a bias magnetic field for each MTJ element group, wherein the pair of the second permanent magnets have a magnetization set at an oblique angle with respect to the sensitive direction to provide a parallel bias field component that is parallel to the sensitive direction to cancel Neel coupling generated by the corresponding MTJ element group to also provide a perpendicular bias field component that is perpendicular to the sensitive direction to ensure the MTJ element operates in a linear region.

19. The magnetoresistive gear tooth sensor of claim 18, further comprising a microcontroller electrically interconnected with the at least one sensor bridge, wherein the microcontroller is used to determine the position of a gear tooth according to a relationship between the position of the gear tooth and the voltage signals of the magnetoresistive gear tooth sensor.

20. The magnetoresistive gear tooth sensor of claim 18, wherein the at least one sensor bridge comprises two full sensor bridges, the sensor further comprising further comprising a microcontroller, wherein each arm of the two full sensor bridges includes a MTJ element group, and the microcontroller is used to determine the movement direction of a gear using the voltage output of the magnetoresistive gear tooth sensor.

* * * * *

UNITED STATES PATENT AND TRADEMARK OFFICE
CERTIFICATE OF CORRECTION

PATENT NO. : 10,060,941 B2
APPLICATION NO. : 14/405736
DATED : August 28, 2018
INVENTOR(S) : Bai et al.

Page 1 of 1

It is certified that error appears in the above-identified patent and that said Letters Patent is hereby corrected as shown below:

In the Claims

In Column 16, Lines 13-14, in Claim 20, delete "further comprising further comprising" and insert --further comprising-- therefor Signed and Sealed this
Twenty-second Day of December, 2020

Andrei Iancu
*Director of the United States Patent and Trademark Office*